United States Patent [19]

Hoenig

[11] 4,302,665
[45] Nov. 24, 1981

[54] CIRCUIT FOR MEASURING THE DURATION OF A PULSE TRAIN, ITS USE AND CIRCUIT FOR ITS USE

[75] Inventor: Wolfgang Hoenig, Voerstetten, Fed. Rep. of Germany

[73] Assignee: ITT Industries, Inc., New York, N.Y.

[21] Appl. No.: 74,936

[22] Filed: Sep. 13, 1979

[30] Foreign Application Priority Data

Sep. 18, 1978 [DE] Fed. Rep. of Germany ....... 2840555

[51] Int. Cl.³ ............................................. G06M 3/14
[52] U.S. Cl. ........................... 235/92 TF; 235/92 CC; 235/92 EV; 235/92 CA
[58] Field of Search ......... 235/92 TF, 92 FQ, 92 CC, 235/92 EV, 92 CA, 92 T; 324/186; 328/44; 340/23, 24

[56] References Cited

U.S. PATENT DOCUMENTS

| | | | |
|---|---|---|---|
| 3,683,345 | 8/1972 | Faulkes et al. | 235/92 CA |
| 3,860,802 | 1/1975 | Knothe et al. | 235/92 CA |
| 3,868,845 | 3/1975 | Shimizu | 235/92 TF |
| 3,956,616 | 5/1976 | Knollenberg | 235/92 CC |
| 4,161,649 | 7/1979 | Klos et al. | 235/92 CA |

*Primary Examiner*—Joseph M. Thesz
*Attorney, Agent, or Firm*—John T. O'Halloran; Thomas N. Twomey

[57] ABSTRACT

A circuit is provided for the fading compensation in car radio receivers equipped with the so-called traffic decoder decoding for example the area designating signal. An up-down counter, a memory and a coincidence gate are interconnected to maintain the measured pulse duration over a selectable time period.

3 Claims, 4 Drawing Figures

CIRCUIT FOR MEASURING THE DURATION OF A PULSE TRAIN, ITS USE AND CIRCUIT FOR ITS USE

BACKGROUND OF THE INVENTION

This invention relates in general to a circuit for measuring the duration of a pulse train and more particularly to such a circuit for providing fading compensation radio receivers.

A circuit for measuring the duration of a pulse train has been disclosed in the journal "Elektronik", 1966, pp. 143 to 146, FIG. 9, page 145. In this circuit a counter, during the period to be measured, or an integer multiple thereof serving as the measuring period, counts pulses which are derived from an oscillator serving as the time base. A gate or sequence-control circuit controlled by the pulse train to be measured, is used to control the counter in such a way that the aforementioned oscillator pulses are counted only during the measuring period. The counter reading (count) is made visible with the aid of an indicating or display arrangement for which it is possible to use the most various types of nowadays customary electronic indicating or display means (digital display tubes, LED's, seven-segment displays, etc.).

In particular fields of practical application of such period or duration measuring circuits it is also customary to provide a memory (storage device) beween the counter output and the indicating arrangement, in which the respective count is temporarily stored. This arrangement is customary, for example, with traffic decoders which, among others, also decode the service area identification signal, German Patent Application DE-OS No. 25 18 104. The general principles for designing a traffic radio system may be found in the German technical journal "Funkschau", 1974, pp. 535 to 538.

In conventional circuits for measuring the duration of a pulse train, for example, when designed as service area identification decoders for traffic radio signals, or when designed as a digital voltmeter, it is necessary to make both the measuring and the display insensitive with respect to interferences to which the pulse train to be measured may be subjected. These interferences may become noticeable, on one hand, in that individual pulses are missing and, on the other hand, also in that additional pulses are superposed, or else in that the pulse periods vary. The conventional arrangement according to DE-OS No. 25 18 104, in which instead of the pulses of an oscillator, the oscillations of the 57-kHz identification are counted in the counter following a corresponding frequency division, eliminates these interferences to a certain extent, in that a predetermined count range is used for indicating the same service area identification symbol, that is, within the count range between 16 and 20, the service area "A" is displayed. In this, the rated display is e.g. at the count 18, so that per measuring period it is possible to tolerate a variation of ±2 pulses of the divided 57-kHz identification oscillation.

SUMMARY OF THE INVENTION

It is an object of this invention as defined in the claims, to refine the well known suppression of interferences in such a way that also in the case of longer lasting interferences, the period which occurred prior to the interference, will still be displayed during the interference, and that in response to a change of period, the new period is only displayed after selectable delay time.

According to this invention there is provided a circuit for measuring the period of a pulse train comprising a counter for counting pulses during a period or integer multiple thereof serving as a measuring period, which pulses are derived from an oscillator serving as time base, a memory for storing the count available at the end of the measuring period, an arrangement for indicating the memory contents, a sequence control controlled by the pulse train, a coincidence gate for comparing the count of the counter as achieved after each measuring period with the contents of the memory, and a bidirectional (forward-backward) counter to the counting input of which one counting pulse is applied per measuring period whose counting direction is switched by the coincidence gate to a forward counting in the event of an equality of both the count and the memory contents, but to backward counting in the event of an unequality, which blocks its counting input upon reaching its highest count or its zero position, when simultaneously switched to forward counting or backward counting by the coincidence gate, and which only in its zero position permits the count to be read into the memory.

BRIEF DESCRIPTION OF THE DRAWINGS

This invention will now be explained in greater detail with reference to examples of embodiments shown in FIGS. 1 to 4 of the accompanying drawings, in which.

DETAILED DESCRIPTION OF THE PREFERRED EMBODIMENTS

Figure 1:
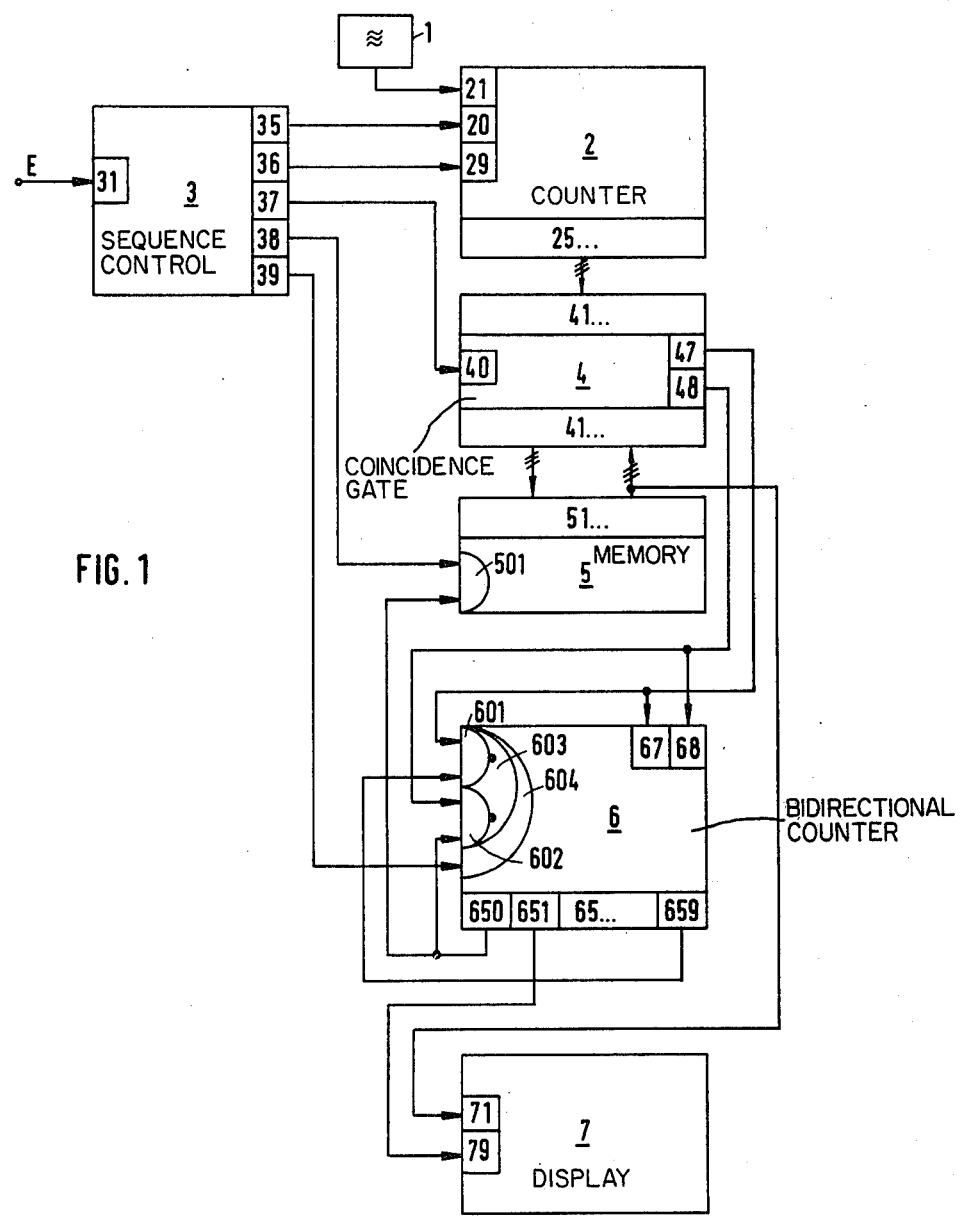
FIG. 1, in the form of a block diagram, shows one example of embodiment of the circuit according to this invention, FIG. 2 shown a preferred type of sequence control which, in the block diagram of FIG. 1, is only shown schematically.

In the example of embodiment of the circuit shown in FIG. 1, the oscillator 1 serving as a time base produces pulses, preferably rectangular pulses which are fed to the input 21 of the counter 2. The pulse train whose duration is to be measured, is applied to the measuring input E of the circuit. This pulse train is applied from the measuring input E to the input 31 of the sequence control 3, the five outputs 35, 36, 37, 38, 39 of which are connected in a way still to be described hereinafter, to the further partial circuits, with the temporal assignment of the signals thereof controlling the intended measuring operation.

Thus, the output signal of the first output 35 is applied to the condition input 20 of the counter 2, upon activation of which the counting operation is released via the counter input 21. The second output 36 of the sequence control 3 is connected to the reset input 29 of the counter 2, so that an output signal appearing at the second output 36 will serve to reset the counter 2 via the reset input 29.

The counter reading outputs 25 . . . of the counter 2, via corresponding lines which, in FIG. 1, are indicated by the shown arrow with three hatchlines, are connected to the one part of the inputs 41 . . . of the coincidence gate 4, while the other part is connected to the inputs 51 . . . of the memory 5. The third output 37 of the sequence control 3 is connected to the condition input 40 of the coincidence gate 4 for serving the comparison, so that an output signal appearing at this particular output will trigger the comparison operation of the coincidence gate 4.

The input stage of the bidirectional counter 6 consists of four logic gates, each having two inputs, namely the two NAND-gates 601, 602, the AND-gate 603 connecting the outputs thereof, as well as the AND-gate 604 connecting the output thereof, as well as the fifth output 39 of the sequence control 3.

The first output 47 of the coincidence gate 4 conditioning the forward counting direction of the bidirectional counter 6, is connected to the one input of the first NAND-gate 601, while the second output 48 of the coincidence gate 4, conditioning the backward counting direction of the bidirectional counter 6, is applied to the one input of the second NAND-gate 602. The second input of the first NAND-gate 601 is connected to the counter reading output 659 serving the highest count of the bidirectional counter 6, and the second input of the second NAND-gate 602 is applied to the counter reading output 650 serving the zero setting of the bidirectional counter 6.

Moreover, the first output 47 of the coincidence gate 4 is connected to the forward-condition input 67, and the second output 48 to the backward-condition input 68 of the bidirectional counter 6. One of the lower counter reading outputs, hence the counter reading output 651 serving the count one in the example of embodiment shown in FIG. 1, finally, is connected to the blanking input 79 of display 7 whose input 71 is connected to the inputs 51 . . . of the memory 50, at which the information to be displayed appears permanently.

In the example of embodiment shown in FIG. 1, the control stage of the memory 5 consists of the third AND-gate 501 whose first input is connected to the fourth output 38 of the sequence control 3, and whose second input is connected to the counter reading output 650 serving the zero setting of the bidirectional counter 6.

Figure 2:
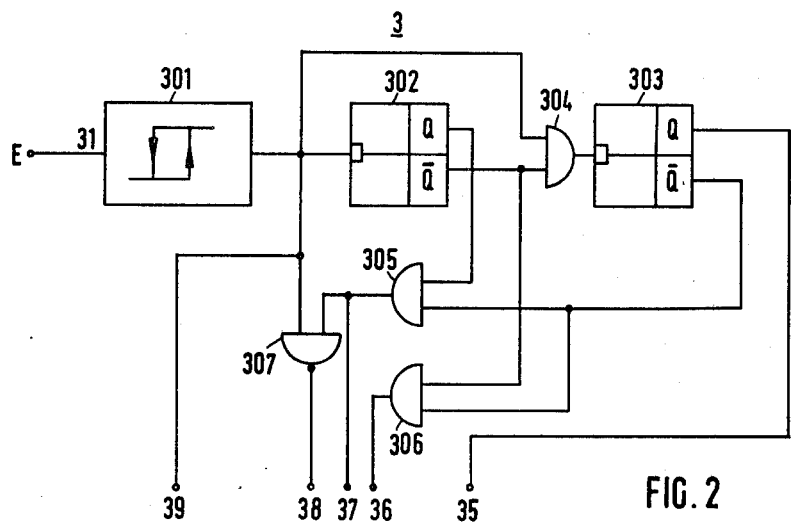

As one preferred example of embodiment relating to the sequence control 3, FIG. 2 shows an arrangement containing the pulse shaper 301, which is preferably a Schmitt trigger, as well as the first and the second binary divider 302, 303, the fourth, fifth and sixth AND-gates 304, 305, 306, and the third NAND-gate 307. From the arbitrarily shaped pulses as applied to the input E, the pulse shaper 301 forms rectangular pulses having a pulse duty factor of about 0.5 which are directly applied to the fifth output 39 and are fed from there, as already mentioned, to the second input of the second AND-gate 604. Moreover, the output signal of the pulse shaper 301 is applied, on one hand, directly to the input of the binary divider 302 and, via one input of the fourth AND-gate 304, also to the input of the binary divider 303. The Q-output of the first binary divider 302 is applied to the one input of the fifth AND gate 305, while the Q-output of the first binary divider 302 is applied to the second input of the fourth AND-gate 304. Accordingly, by inserting the fourth AND-gate 304, it is achieved that the pulse duration of the input signal of the second binary divider 303 becomes equal to that of the input signal of the first binary divider 302.

The second input of the fifth AND-gate 305 is applied to the Q-output of the second binary divider 303 and to the second input of the sixth AND-gate 306 whose first input is applied to the Q-output of the first binary divider 302. The output signal of the sixth AND-gate 306 is applied to the second output 36 which, as already mentioned hereinbefore, and via the reset input 29, controls the resetting of the counter 2.

The Q-output of the second binary divider 303 is applied to the first output 35 which, via the condition input 20 of the counter 2, controls the beginning and the end of the counting operation thereof. The output of the fifth AND-gate 305 is applied to the third output 37 which, via the condition input 40 of the coincidence gate 4, triggers the comparison between the count of the counter 2 and the storage contents of the memory 5, and terminates this operation.

Moreover, the output of the fifth AND-gate 305 is applied to the second input of the third NAND-gate 307 to the first input of which the output signals of the pulse shaper 301 are applied, and whose output signal, via the fourth output 38 and the first input of the third AND-gate 501, dynamically controls the takeover of the count (counter reading) 25 . . . into the memory 5.

Figure 3:
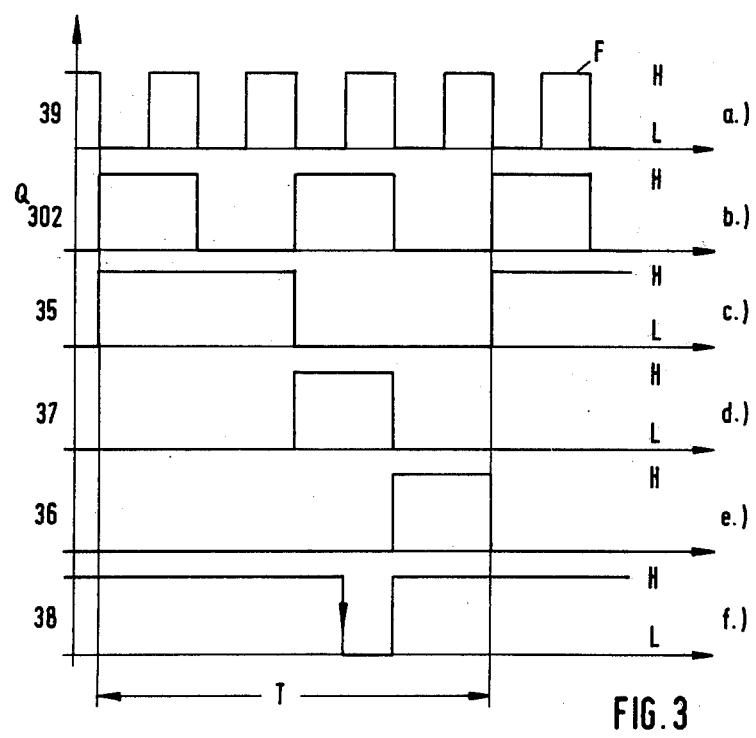
FIG. 3 shows the signal waveforms as appearing at the various outputs of the sequence control according to FIG. 2, and FIG. 4, in the form of a diagram, shows one possible sequence of counts of the bidirectional counter according to FIG. 1.

For enabling a better understanding of the invention FIG. 3 shows some signal waveforms of the type as occurring in the arrangement according to FIG. 2 FIG. 3a shows the waveform of the output signal of the pulse shaper 301 and consequently, also of the signal as appearing at the fifth output 39 of the sequence control 3. This signal represents the pulse train F which is to be measured. By a single binary division carried out in the first binary divider 302 there will result from the signal waveform of FIG. 2a, that as shown in FIG. 2b, as appearing at the Q-output $Q_{302}$ of the first binary divider 302. By a repeated frequency division carried out in the second binary divider 303 there will appear at the first output 35 the signal waveform as shown in FIG. 3c. Owing to the chosen logical interconnection, the waveform as shown in FIG. 3d will appear at the output of the fifth AND-gate 305 and, consequently, also at the third output 37, while at the output 36, there will appear the signal waveform as shown in FIG. 3e. Finally, the signal waveform as shown in FIG. 3f appears at the output 38. All of the partial circuits of the sequence control 3 operate in a so-called positive logic, that is, upon application of the upper binary signal level H to the two inputs of an AND-gate, an H-level is likewise supposed to appear at the output thereof. Relative thereto, the L-level corresponds to the low binary signal level.

It can be easily seen from the signal waveforms of FIG. 3, that the measuring period T during which pulses from the oscillator 1 of FIG. 1 reach the counter 2, covers four periods of the pulse train F, hence is equal to the period of the output signal of the second binary divider 303. Moreover, it can be seen from FIG. 3, that during the first half of each measuring period T, hence while the signal at the Q-output of the second binary divider 303 assumes the H-level, the counter 2 can count pulses from the oscillator 1. Furthermore, during the third quarter of each measuring period T, hence while the signal at the third output 37 assumes the H-level, the coincidence circuit 4 compares the just reached count of the counter 2 with the count just stored in the memory 5. During the last quarter of each measuring period T, hence while the signal at the output 36 assumes the H-level, the counter 2 is reset, and at the end of the fifth eighth of each measuring period T, the just reached count of the counter 2 is read into the memory 5 dynamically, with this being indicated by the downwardly directed arrow in FIG. 3f.

Figure 4:
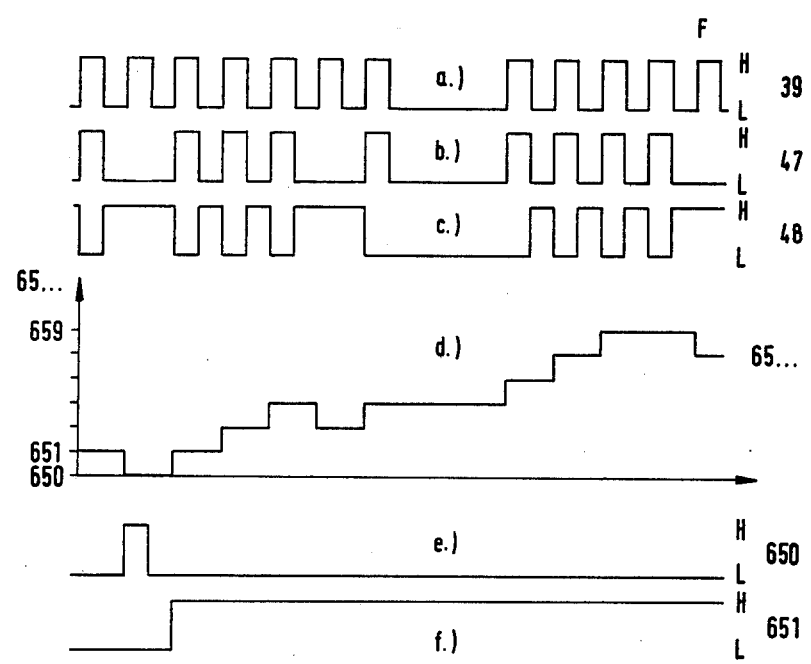

Further signal waveforms are shown in FIG. 4. Thus, FIG. 4a, again shows the pulse train F in the course of which, in fact, there appears a gap which is due to an interference, but which is not visible in the display of the display arrangement 7. FIGS. 4b and 4c show the respective output signal at the first and second output 47, 48 of the coincidence gate 4, with an H-level at the first output 47 at the same time meaning an L-level at the output 48, and vice versa. Merely, for the sake of a better understanding, the drawing shows a pulse duty factor of 0.5; in the most simple case, of course, the pulse duty factor has the value of 0.25. FIG. 4d shows the course of the counts 65 ... of the bidirectional counter 6 relating to an assumed signal waveform of the pulse train F. Together with the H-level at the counter reading output 650 serving the zero setting of the bidirectional counter 6 (FIG. 4e) there will thus result the shown signal waveform.

In order to be able to understand the following explanation, it is necessary to count the pulses of the pulse train F in FIG. 4a consecutively from the left to the right. Thus, at the first pulse, the count of the bidirectional counter 6, by starting from a not particularly stated previous count, will assume the count 651. At the second pulse the H-level at the second output 48 of the coincidence gate 4 indicates the unequality of both the count of the counter 2 and the contents of the memory 5, so that the bidirectional counter 6, via its backward-condition input 68, is switched in the backward direction and, owing to the pulse applied via its input part, assumes the zero position 650. At the third pulse of the pulse train F, the coincidence gate 4 will again determine the equality of both the count of the counter 2 and the contents of the memory 5, so that owing to the H-level at the first output 47, the bidirectional counter 6 via its forward-condition input 67, is switched in the forward direction and, via the pulse applied via its input part, reassumes the count (reading) 651. The same is repeated at the fourth and the fifth pulse of the pulse train F, so that the count of the bidirectional counter 6 has now arrived at three. By the sixth pulse of the pulse train F, the bidirectional counter 6 is again switched to the backward direction and is reset by one, while at the seventh pulse there is again switched to the forward direction, and counted correspondingly. Now there appears the aforementioned gap in the pulse train F, and since the sequence control 3 forms all control signals from the pulse train F, the entire measuring process will so to speak comes to a standstill on the already reached results.

Following the gap which is due to an interference, and during the eighth, ninth and tenth pulse, there is again determined the equality between the counter reading and the memory contents, with the counter thus being counted up to the highest count (reading) 659. Also at the eleventh pulse at which there is again determined the equality between the count and the memory contents, the bidirectional counter 6 remains at its highest count 659, because a counting pulse is not permitted to pass by the input stage thereof. The input stage of the bidirectional counter 6, incidentally shows a similar behavior upon reaching the zero position 650 in the case of a simultaneous backward counting direction.

Accordingly, with respect to signal gaps which are due to interferences, or in the case of any other momentary variations of the period to be measured, the circuit of the invention shows to have an integrating character, so that this will only lead to a corresponding change in the display arrangement 7 after there has been detected a change in the period to be measured, extending over several counting cycles of the bidirectional counter 6. The integrating time, hence the aforementioned delay time, is determined by the counting capacity of the bidirectional counter 6, and is set thereby.

The circuit according to the invention can be used particularly well in a traffic decoder, with the measuring period T being derived from the aforementioned service area identification oscillation, and the oscillator 1 preferably being a crystal oscillator, that is, to the input E of the circuit according to the invention there are applied the a.c. signals of corresponding frequencies relating to the service areas A ... F, as known in detail from pages 535 to 538 of the German technical journal "Funkschau", 1974. Accordingly, owing to the already mentioned integrating effect, especially when used as a traffic decoder decoding the service area indentification signals, the individual areas are automatically displayed, and a switching of the display from one area identification code to another one is only released when the static errors have decayed below the extent of the interference suppression as determined by the maximum count (reading) of the bidirectional counter 6.

For realizing the circuit according to the invention it is particularly suitable to employ the monolithic integrated circuit technique. In one preferred kind of realization, there is used the well known so-called integrated injection logic ($I^2L$) technique.

Whereas this invention has been described with respect to specific embodiments thereof, it will be understood that various changes and modifications will be suggested to one skilled in the art, and it is intended to encompass such searches and modifications as are within the scope of the appended claims.

What is claimed is:

1. A circuit for measuring the period of a pulse train comprising:
    means for generating pulses at regular intervals, a predetermined number of said pulses defining a measuring period,
    a counter for deriving a count during said measuring period, said counter having a counting input, a condition input and a reset input,
    a memory for storing the count available at the end of said measuring period,
    an arrangement for indicating the memory contents,
    a coincidence gate for comparing the count of the counter after each measuring period, with the contents of the memory,
    a bidirectional forward-backward counter, having a highest value and a zero position and including a counting input to which one counting pulse is applied per measuring period, wherein said bidirectional counter is switched by the coincidence gate to a forward counting in the event of an equality of both the count and the memory contents, and to backward counting in the event of an unequality, and wherein its counting input is blocked upon reaching its highest value or its zero position when simultaneously switched to forward counting or backward counting by the coincidence gate, and which only in its zero position permits the count to be read into the memory, and a sequence control circuit controlled by said pulse train, said control circuit having an input to which the pulse train is applied and first through fifth outputs, said first output providing a condition signal to said condition input of said counting means, said second output providing a reset signal to said reset input of said counting means, said third output providing a condition signal to said coincidence gate, said fourth output providing a control signal to said memory, and said fifth output providing a pulse signal to an input of said bidirectional counter.

2. The circuit according to claim 1 for use with a traffic radio decoder, wherein said measuring period is derived from an area indentification oscillation, and said means for generating pulses comprises a crystal oscillator.

3. The circuit according to claim 2, wherein:

the indicating arrangement for the memory contents is blanked during some of the initial counts of the bidirectional counter, said area identification oscillation is supplied to a pulse shaper which produces a pulse train preferably having a pulse duty factor of about 0.5, said measuring period is determined by dividing the frequency of said pulse train by use of two series arranged binary dividers, and said sequence control actuates counting of said counter during the first half of each measuring period, enables the comparison by coincidence gate during the third quarter of each measuring period, enables the resetting of the counter during the fourth quarter of each measuring period, and enables the reading of the content of the counter into the memory at the end of the fifth eighth of each measuring period.

* * * * *